United States Patent
Farrell et al.

(10) Patent No.: US 9,466,747 B1
(45) Date of Patent: Oct. 11, 2016

(54) AVALANCHE PHOTODIODE AND METHODS OF FORMING THE SAME

(71) Applicant: Radiation Monitoring Devices, Inc., Watertown, MA (US)

(72) Inventors: Richard Farrell, Newton, MA (US); Richard Myers, Needham, MA (US); Kofi Vanderpuye, Belmont, MA (US); Mickel McClish, Salem, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 0 days.

(21) Appl. No.: 13/660,423

(22) Filed: Oct. 25, 2012

Related U.S. Application Data (60) Provisional application No. 61/551,379, filed on Oct. 25, 2011.

(51) Int. Cl.
 H01L 31/107 (2006.01)
 H01L 31/0352 (2006.01)
 H01L 31/18 (2006.01)

(52) U.S. Cl.
 CPC ......... H01L 31/03529 (2013.01); H01L 31/18 (2013.01)

(58) Field of Classification Search
 CPC ............ H01L 27/14643; H01L 31/18; H01L 25/167; H01L 29/66113; H01L 31/03529; H01L 29/7886; H01L 31/0207; H01L 31/107
 USPC ............ 257/80, 186, 438, E31.05, 233, 292, 257/481, 551; 438/478, 745, 91, 380
See application file for complete search history.

(56) References Cited

U.S. PATENT DOCUMENTS

| | | | | |
|---|---|---|---|---|
| 4,326,211 | A * | 4/1982 | Smeets | 257/438 |
| 7,045,833 | B2 * | 5/2006 | Campbell | H01L 31/107 257/185 |
| 7,583,364 | B1 * | 9/2009 | Mayor | G01N 21/538 356/337 |
| 2004/0245592 | A1 * | 12/2004 | Harmon | G01J 1/4228 257/438 |
| 2007/0023831 | A1 * | 2/2007 | Kitagawa | H01L 25/167 257/342 |
| 2009/0242933 | A1 * | 10/2009 | Hu | H01L 31/107 257/186 |
| 2010/0072518 | A1 * | 3/2010 | Shen | H01L 21/30617 257/197 |
| 2010/0256918 | A1 * | 10/2010 | Chen | C12Q 1/6869 702/19 |
| 2012/0009722 | A1 * | 1/2012 | Sanfilippo | H01L 27/1446 438/72 |
| 2012/0043584 | A1 * | 2/2012 | Joshi | H01L 31/02024 257/184 |
| 2012/0190150 | A1 * | 7/2012 | Levine | H01L 27/14643 438/72 |
| 2013/0109977 | A1 * | 5/2013 | Nikzad | A61B 5/0077 600/476 |
| 2013/0187251 | A1 * | 7/2013 | Yamamura | H01L 27/1446 257/438 |
| 2013/0313579 | A1 * | 11/2013 | Kouvetakis | H01L 31/028 257/80 |

* cited by examiner

Primary Examiner — Jarrett Stark
Assistant Examiner — Shahed Ahmed
(74) Attorney, Agent, or Firm — Wolf, Greenfield & Sacks, P.C.

(57) ABSTRACT

Solid state avalanche photodiode devices and methods of producing the same are described herein.

24 Claims, 8 Drawing Sheets

AVALANCHE PHOTODIODE AND METHODS OF FORMING THE SAME

CROSS-REFERENCE TO RELATED APPLICATIONS

This application claims the benefit of U.S. provisional application Ser. No. 61/551,379 filed on Oct. 25, 2011, which is incorporated herein by reference in its entirety.

FIELD OF INVENTION

Aspects relate generally to the field of detection with solid state avalanche photodiode devices.

BACKGROUND

There has been a significant need in many fields for high quantum efficiency, high speed response light detectors, particularly in the blue and near ultraviolet, (200 to 500 nm) as well as for particle detection, and low-energy X-rays. In many applications there is a further need for miniature, portable, rugged, field ready devices, which drives requirements away from photomultiplier tubes and towards solid state devices. In many applications requiring such solid state devices there is a need for relatively large surface area devices. Larger area devices intrinsically have lower signal to noise (SNR) and longer response time than smaller area devices.

Many nuclear detection devices utilize scintillators that convert nuclear energy to light. Most scintillators emit light in the region of 200 to 500 nm. This light must be read or monitored with an appropriate light detector. In many applications a scintillating crystal or ceramic is mounted directly onto a solid state detector such as an avalanche photodiode. This method of direct coupling significantly improves the efficiency of detection. In medical applications such as PET and CT scanning high sensitivity and short response time are required to reduce the patient's exposure to radiation as much as possible. Thus, there is a critical need in nuclear medicine for high quantum efficiency, high speed response, and often large surface area devices.

In other medical applications where detectors are in direct contact with the patient there is the further requirement that the bias voltage that drives the device be as low as possible for reasons of patient safety.

There is also a need for high quantum efficiency, high speed response, and often large surface area light detectors in military applications, such as tracking, targeting, and ranging devices. This is particularly the case for daylight applications where military operations are conducted in the presence of large amounts of visible and infrared light. The human eye has little sensitivity at wavelengths below 400 nm. For laser exposure, there is an "eye safe" UVA region between 315 and 400 nm (ideal, for instance, for operation with tripled Nd:YAG lasers at 355 nm or with solid state lasers emitting in this spectral band region). Solar radiation is minimal in the UVA band and can be significantly further reduced by use of appropriate band pass or short pass filters. These filters can, in many instances, be directly coated onto the detector or an appropriate filter can be placed in the path of incoming light. For tracking and targeting applications it may also be advantageous to use positional sensitive detectors, based on arrays of detectors and/or proportional detectors.

Scientific research instrumentation often requires high quantum efficiency, high speed response, and often large surface area devices in the spectral region between 200 and 1050 nm. Such applications include, but are not limited to, radiation detectors employing scintillators, radiation detectors based upon Cherenkov radiation, radiation detectors for X-ray detection, radiation detectors for ionizing particle detection and astronomical measurements in this spectral region.

Over the past two decades, free-space optical communication (FSOC) has proven to be a viable way to transfer large packets of digital information. Capable of achieving Gbit/s transfer rates over several km, relatively compact systems for local area networks are commercially available. However, the technology required to deploy robust system architectures, such as those used on temporary or mobile platforms operating in a range of daylight and temperature conditions, has yet to be fully realized.

A significant operational barrier for FSOC is the need to maintain eye-safety, which limits the permissible signal power and thus system ranging capabilities. Poor weather conditions, the need for direct line-of-sight, and interference with solar radiation within the receiver's line-of-sight are also factors that can significantly degrade the system performance. Despite these factors, FSOC offers significant advantages over commonly used microwave links. These advantages include: smaller size, weight and power requirements for the transmitter and receiver; higher immunity to electromagnetic interference; faster data transfer rates; and higher security due to directionality.

Such optical communication systems consist of two primary components; namely the transmitter and the receiver. Medium-range FSOC systems have been realized thanks to advances in laser transmitter and LED technology in the ultraviolet (UV). Compared to systems that utilize red or near-IR sources, the advantages of using a UV source include higher permissible transmission levels and reduced interference from solar radiation. Strong absorption and Rayleigh scattering in the atmosphere greatly reduces the solar background in the deep UV (wavelengths<280 nm). However, this same scattering and absorption may also reduce the distance over which the communication signal can be relayed, particularly at sea level where water content is high. As a result, the use of deep UV has been proposed for short range non-line of sight (NLOS) operations where the scattered light is used to relay the signal around objects [2]. For medium to long range communications, therefore, longer wavelengths near the blue-UV region of the spectrum (350 to 380 nm) are preferred.

The advantage created by recent advances in transmitter technology for UV FSOC has been dampened by the lag in the development of matching receiver technology for the UV. In particular, the highest quantum efficiency (QE) (the ratio between the number of photon-induced electrons collected and the number of incident photons) is approximately 50% for detectors at UN wavelengths, compared to >90% at the longer wavelengths. Table 1 compares the QE of various large-area UV-blue sensitive detectors when operated in proportional mode at the common laser wavelength of 355 nm (Nd:YAG).

TABLE 1

| Detector type | Gain | QE (at 355 nm) |
| --- | --- | --- |
| Silicon detector | 1 | 50% |
| Avalanche Photodiode | 200 | 50% |
| Photomultiplier Tube | $10^6$ | 25% |
| Silicon Carbide | 1 | <10% |

Silicon detectors have the highest QEs at 355 nm, which is two to three times higher than photomultiplier tubes (PMTs) and six to seven times higher than silicon carbide detectors, which have a peak response at shorter wavelengths. Silicon p-i-n photodiodes are compact, rugged high-speed optical receivers that are relatively inexpensive and require low operating bias. However, their signal-to-noise ratio (SNR) is much lower than detectors with internal gain structures, such as APD's or PMTs. As a result, post-amplification circuits are often needed to generate appropriate signal outputs, further reducing the SNR.

Avalanche photodiodes (APD's), like the PMTs, exhibit internal gain created by impact ionization, when a strong electric field is present in the detector. However, APD's are much thinner than PMTs, which increases design flexibility, enabling improved light collection geometries. Unlike the PMT, the APD is very rugged, does not require a recovery period (several to tens of minutes) following intense illumination from an unexpected signal or background source, can be operated in magnetic fields, and can be mass produced at low costs. As a result, APD's are often the detector of choice for field-ready instrumentation such as FSOC.

Figure 1:
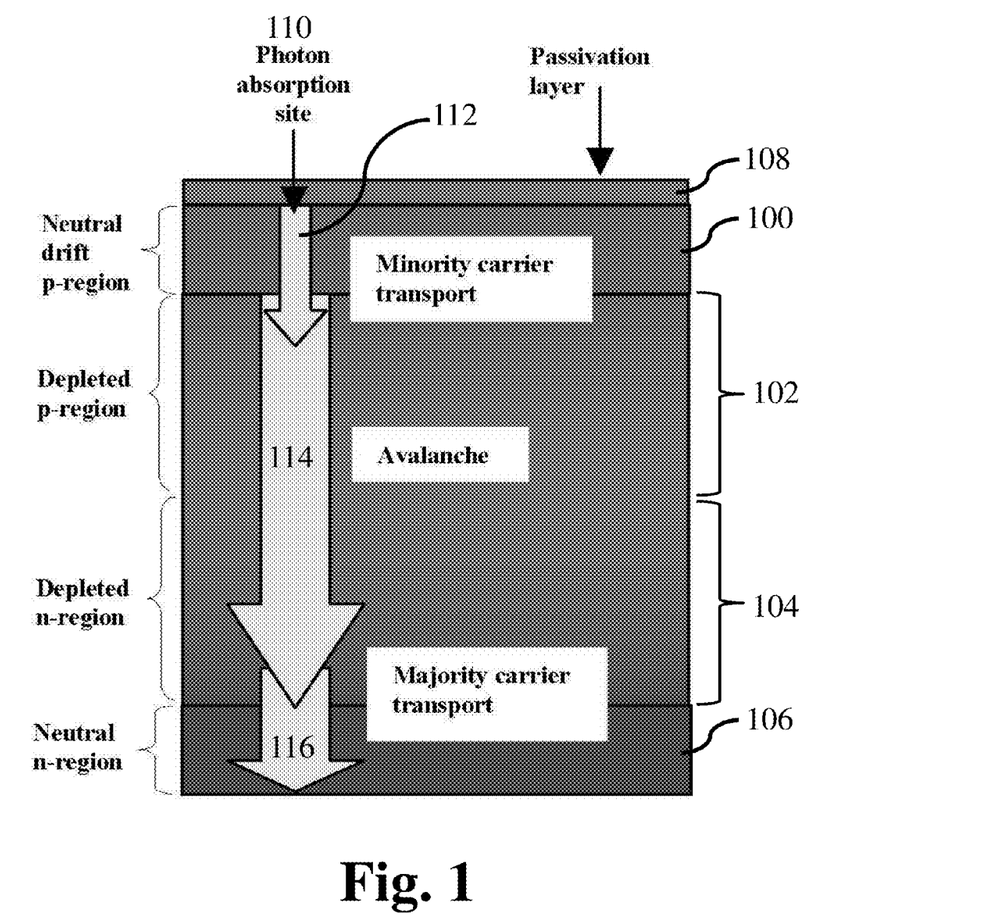
FIG. 1 shows a schematic cross-sectional view of an avalanche photodiode.

An exemplary APD is depicted in FIG. 1. The substrate contains different regions that correspond to differing amounts of dopant present in that region. For example, an APD may include a photosensitive neutral drift p-region 100 located at, or adjacent to, the top surface of the APD. A depleted p-region 102 may be located beneath the neutral drift region. A depleted n-region 104 may be located beneath the depleted p-region. A neutral n-region 106 may be located beneath the depleted n-region. In some cases the APD may also include a passivation layer 108 disposed on top of the neutral drift p-region. During use an electrical potential may be applied to the APD such that when a photon is absorbed by the photosensitive neutral drift p-region, an electron-hole pair is formed at photon absorption site 110. Due to the applied electrical potential the charge carriers, i.e. the electron and hole, move in opposite directions within the APD. This initial migration of a charge carrier towards the bottom of the APD is indicated by arrow 112 which corresponds to minority carrier transport. As the charge carrier is accelerated due to the applied electrical potential it causes additional electron hole pairs to be formed within the depleted p-region and depleted n-region due to impact ionization which then exhibit similar behavior. This process is referred to as avalanche breakdown and is indicated by enlarged arrow 114. This phenomenon is responsible for the signal gain exhibited by avalanche photodiodes. After passing through the depleted p-region and depleted n-region the generated charge carriers undergo majority carrier transport to the neutral n-region which includes electrical contacts for outputting the generated electrical signal.

SUMMARY OF INVENTION

Solid state avalanche photodiode devices and methods of producing the same are described herein.

In one aspect, a method is provided. The method comprises providing a doped substrate comprising a photosensitive surface, removing material from the photosensitive surface, growing an epitaxial layer disposed on the photosensitive surface, and doping the epitaxial layer. The doping concentration of the epitaxial layer varies across a thickness of the epitaxial layer and the doping concentration gradient is greater in the epitaxial layer than in the doped substrate.

In another aspect, an avalanche photodiode is provided. The avalanche photodiode comprises a doped substrate including a photosensitive surface and a drift region having a thickness of approximately 5 μm or less, and an epitaxial layer disposed on the photosensitive surface. A doping concentration of the epitaxial layer varies across a thickness of the epitaxial layer.

Other aspects, embodiments and features of the invention will become apparent from the following detailed description of the invention, when considered in conjunction with the accompanying drawings. It should be understood that aspects of the invention are described herein with reference to the figures, which show illustrative embodiments of the invention. The embodiments described herein are not necessarily intended to show all aspects of the invention. It should be appreciated, then, that the various concepts and embodiments introduced above and those discussed in greater detail below may be implemented in any of numerous ways, as the disclosed concepts and embodiments are not limited to any particular manner of implementation. In addition, it should be understood that aspects of the invention may be used alone or in any suitable combination with other aspects of the invention

BRIEF DESCRIPTION OF THE DRAWINGS

The accompanying drawings are not intended to be drawn to scale. In the drawings, each identical or nearly identical component that is illustrated in various figures may be represented by a like numeral. For purposes of clarity, not every component may be labeled in every drawing. Various embodiments of the invention will now be described, by way of example, with reference to the accompanying drawings, in which.

DETAILED DESCRIPTION

The inventors have recognized and appreciated a need for an avalanche photodiode with an improved collection efficiency of charges created near the surface of the structure to provide an improved Quantum Efficiency. More specifically, the inventors have recognized and appreciated the benefits of reducing the thickness of the photodiode drift region of an avalanche photodiode and providing an epitaxial layer with a greater concentration gradient on the reduced thickness drift region.

In a typical avalanche photodiode (APD) standard diffusion-based processing may be used to create a surface gradient to promote charge migration into the avalanche region, resulting in an approximately 10 µm thick drift region under full bias. Without wishing to be bound by theory, the relatively thick drift region reduces the probability that electron-hole pairs created near the surface will migrate into the high gain avalanche region prior to trapping or recombination. However, reducing the thickness of this drift region and creating a sharper doping gradient is challenging with existing diffusion processes. To overcome this limitation in conventional technology, an epitaxial layer of silicon may be deposited on the photosensitive anode surface (i.e. the top surface) of a standard APD structure following mechanical or chemical removal of the drift region or a portion of the drift region. This epitaxial layer can have a very steep diffusion profile to condense the thickness of the drift layer, yet provide the necessary field gradient to reduce the chances of recombination at the surface. In some embodiments the drift region may be reduced to less than approximately 5 µm, with a steep doping profile. The steep doping profile may be provided by an epitaxial layer deposited on the reduced thickness drift region. This method may be implemented with well-established semiconductor processing methods and tools. This enables, high precision control of the doping concentration and thickness. Alternatively, highly controlled diffusion or ion implantation can also be used to create the steep doping gradient. Implementation of this alternative process might require modification to the final device thickness and doping concentrations.

Devices produced using the above noted method may exhibit improved quantum efficiency, responsivity, and speed of response in the blue region of the spectrum.

Figure 2:
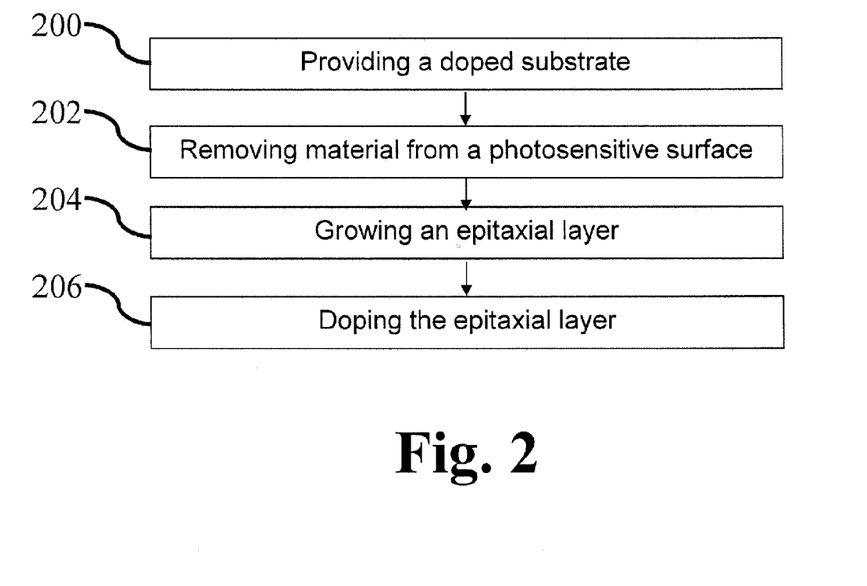
FIG. 2 depicts an exemplary process flow diagram for producing an avalanche photodiode according to the currently disclosed method.

In one embodiment, as depicted in FIG. 2, a method for producing a modified APD includes the initial step 200 of providing a doped substrate. The doped substrate may include a photosensitive surface that generates an electrical signal in response to an incident photon. In a preferred embodiment, the doped substrate may be an avalanche photodiode.

In step 202, material may be removed from the photosensitive surface of the substrate. The material may be removed using any applicable methods including, but not limited to, mechanical grinding and polishing, chemical etching and polishing, and electrochemical etching and polishing. The amount of material removed from the photosensitive surface may reduce the thickness of the drift region of the substrate to approximately less than or equal to 10 µm, less than or equal to 5 µm, or less than or equal to 2 µm.

After removing the material from the photosensitive substrate, an epitaxial layer may be deposited during step 204 onto the photosensitive surface of the substrate. The epitaxial layer may be a silicon based layer and it may range in thickness from 0.1 µm to 10 µm. In other embodiments, the epitaxial layer may be less than or equal to 5 µm thick. The epitaxial layer may be deposited using any appropriate method including, but not limited to, liquid, solid, or vapor phase deposition. Step 206, corresponding to doping the epitaxial layer, may be conducted concurrently with step 204 during which a specified doping concentration profile is deposited with the epitaxial layer. Alternatively, highly controlled diffusion or ion implantation can also be used to create the desired doping concentration profile.

In another more detailed embodiment, the doped substrate may be an n-type (phosphorus-doped) silicon substrate. In other embodiments the starting substrate material may be a material other than silicon such as silicon carbide, germanium, indium gallium arsenide, or other semiconductors and the doping agent may be a material other than phosphorous including, but not limited to, arsenic and antimony. In other embodiments the substrate may comprise a p-type silicon substrate. However, a p-type silicon substrate may not be the preferred embodiment due to a higher number of defects in the starting material. Regardless of the substrate selected, doping of the substrate can be performed using methods such as diffusion or ion implantation. In one embodiment, neutron transmutation doping (NTD) may be used to provide an extremely uniform doping distribution. In some embodiments, the provided doped substrate may be a diffusion doped APD.

The substrate may be provided in the form of silicon wafers. The wafers may range from approximately 25 mm to 300 mm in diameter. In certain embodiments approximately 4-inch (100 mm) diameter wafers may be used for processing convenience and to limit handling challenges that arise as wafer diameter increases, though it should be understood that the invention is not limited in this regard.

In some embodiments, the substrates may be processed following U.S. Pat. No. 7,268,339, the entirety of which is incorporated herein by reference, for the formation of a double groove photodiode structure. Grooves may also be cut into the substrate wafer to define the active area of individual pixels or pixel arrays and provide the introduction of a beveled p-n junction.

Thermal diffusion of p-type dopants may be performed on the substrate wafer to create p-n junctions on the wafer to define the diode structure. Subsequently, the substrate wafer may be thinned in order to define the appropriate device thickness to achieve high gain and low noise characteristics. Thinning may be done to both sides of the wafer using grinding and/or other standard semiconductor processing methods. In a preferred embodiment the grinding may be done using the industry standard of 2000 grit. In a preferred embodiment, the photosensitive p-side of the wafer may be ground to within approximately 60 µm to 75 µm of the p-n junction. The n-side of the wafer may be ground to within 200 µm of the p-n junction. Thus, the amount of material removed from the p-side and the n-side may be determined by the depth of the p-n junction from the surface. In a preferred embodiment another 10 to 15 µm may be removed from both sides using chemical polishing or any other appropriate polishing technique. Thus the resulting photosensitive p-type surface may be within 45 µm to 20 µm of the p-n junction. Alternatively, the additional material may be removed through a combination of grinding and/or polishing and may be between approximately 5 µm to 10 µm, 10 µm to 20 µm, 20 µm to 30 µm, 30 µm to 40 µm, or more than 40 µm. The resulting location of the photosensitive p-type surface may be defined relative to the location of the p-n junction. While particular amounts of material removal and locations relative to the p-n junction have been specified above, it should be understood that other depths greater than or less than the amounts listed above are contemplated as being part of the current disclosure for both the initial ground depth and final polished depth.

In some embodiments, the removal of material from the n-side can be split into two parts with some or all of the removal being done prior to the application of the final p-side layer and some or all of the removal being done post application. In some embodiments, all of the removal may be done prior to the application of the epitaxial layer. A significant challenge in the fabrication of the modified APD's was preparation of the boundary between the silicon substrate and the deposited epitaxial layer. Therefore, without wishing to be bound by theory, following silicon removal it may be desirable to minimize the density of defects at the interface between the surfaces to improve the resulting final interface between the layers. This may be accomplished by adding a polishing step. Alternatively, the additional material that is removed may be removed using wafer polishing techniques to provide a surface that is ready for application of an epitaxial layer. In another embodiment a final touch polish of the p-side may be done in a clean room environment to prepare the surface for application of an epitaxial layer. In either case, an industry standard, low-defect surface finish may be provided.

As noted above, applying the epitaxial layer and introducing a doping gradient in the epitaxial layer respectively, may be done concurrently, or separately, as the current disclosure is not limited in this fashion. In a preferred embodiment an epitaxial layer of boron doped silicon may be applied to the p-side of the substrate. Alternatively, the epitaxial layer may be doped with aluminum, gallium, or any other appropriate dopant. Regardless of the dopant species used, the doped epitaxial layer can be applied using established methods, including liquid, solid, or vapor-phase techniques. The thickness of the epitaxial layer may be approximately between 0.05 µm to 10 µm, or more preferably approximately 2 µm to 3 µm. Alternatively, the epitaxial layer may be less than 0.05 µm or greater than 10 µm as the current disclosure is not limited in this fashion. In some embodiments, the epitaxial layer may have at least two or more distinct growth regions. The at least two or more growth regions may have distinct doping concentration gradients. In a preferred embodiment, a first region may start from an outer surface of the epitaxial layer and may extend to 0.1 µm below the outer surface. A corresponding second region may be defined between the epitaxial-silicon wafer interface and the first region. The doping concentration gradient may be greater in the first region than in the second region. For example, the doping concentration of the first region may vary from approximately $10^{21}/cm^3$, or from approximately $10^{20}/cm^3$, or from approximately $10^{19}/cm^3$ to approximately greater than $10^{16}/cm^3$ over a 0.1 µm thickness. The corresponding doping concentration of the second region may range from approximately greater than $10^{16}/cm^3$ to approximately $10^{15}/cm^3$ over the remaining epitaxial layer thickness. Alternatively, the separate regions of the epitaxial layer may include doping concentrations approximately equivalent to, or greater than, $10^{20}/cm^3$, $10^{21}/cm^3$, or any other appropriate concentration. The separate regions may also include doping concentrations less than $10^{16}/cm^3$. In addition, the doping concentration at the interface between the two regions should not be limited to approximately greater than $10^{16}/cm^3$ as any desired concentration may be used. Therefore, while specific doping concentrations have been disclosed above, it would be apparent to one of skill in the art that alternative doping concentrations and profiles could be used to adjust characteristics of a photodetector's response.

Following the application of the epitaxial layer, post application processing may be conducted on the resulting device. For example, additional material may be removed from the n-side of the detector if it was not completed prior to the application of the epitaxial layer and doping gradient. An etch photoresist may be applied to the n-type side. Patterning of contacts may be done using established photolithography methods. Final silicon chemical etching of the structure may also be done. Additional processes that may be desirable include, but are not limited to: applying a passivation layer; mechanical dicing of individual or array structures; packaging the resulting devices on ceramic substrates or other convenient mounts; bonding or soldering contacts for electrical interfacing; depositing an antireflection coating on the epitaxial layer; and/or depositing or placing a long-pass, short pass, or band-pass filter onto the epitaxial layer to remove significant amounts of unwanted radiation.

Figure 3A:
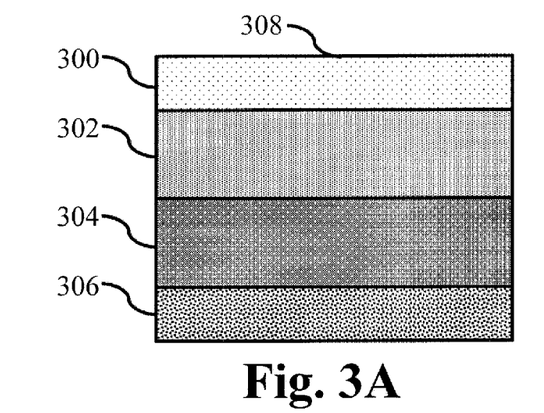
FIGS. 3A-3C show schematic cross-sectional views of an avalanche photodiode in different states of manufacture.
Figure 3B:
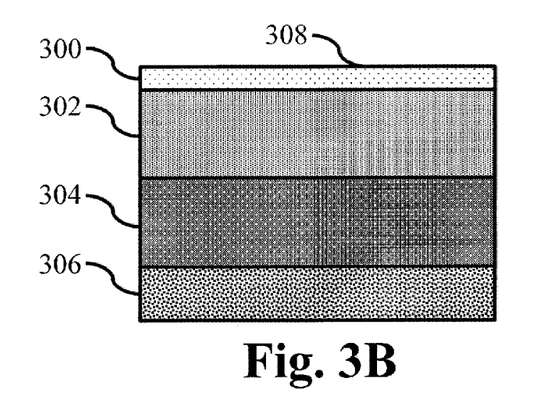
Figure 3C:
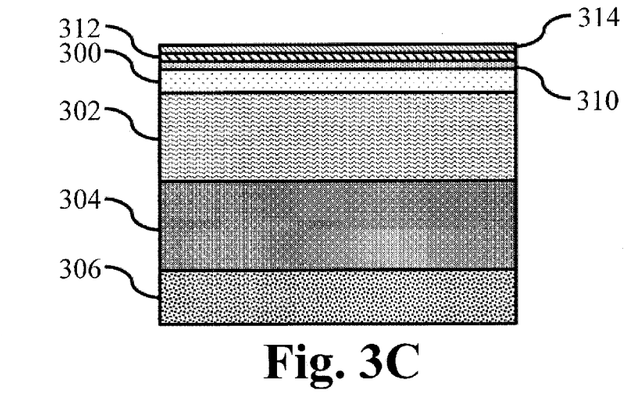

FIGS. 3A-3C depict the preparation of a modified APD from an existing APD according to the methods disclosed above. As noted previously, the APD includes a drift region 300, depleted p-region 302, depleted n-region 304, and neutral n-region 306. The drift region may include an exterior photosensitive surface 308. As detailed above with regards to the disclosed processing methods, and as shown in FIG. 3B, material may be removed from the exterior photosensitive surface of the drift region. In some embodiments, material may also be removed from the underlying p-type depletion region. The resulting full p-type thickness may be between 30 µm to 40 µm thick. Alternatively, the full p-type thickness may be less than 30 µm or greater than 40 µm. Regardless of the absolute amount removed, after reducing the full p-type thickness, epitaxial layer 310 may be deposited onto the top photosensitive surface using any appropriate method including, but not limited to, liquid, solid, or vapor phase deposition. The thickness of the epitaxial layer may be between 0.1 µm to 10 µm. The epitaxial layer may have a doping concentration and concentration gradient that are greater than that of the underlying drift region. In some embodiments, an antireflection coating 312 and/or a filter 314 may optionally be deposited on, operatively coupled to, or placed adjacent to the epitaxial layer. In some embodiments filter 314 may comprise a long-pass, short pass, or band-pass filter adapted to filter significant amounts of unwanted radiation.

Figure 3D:
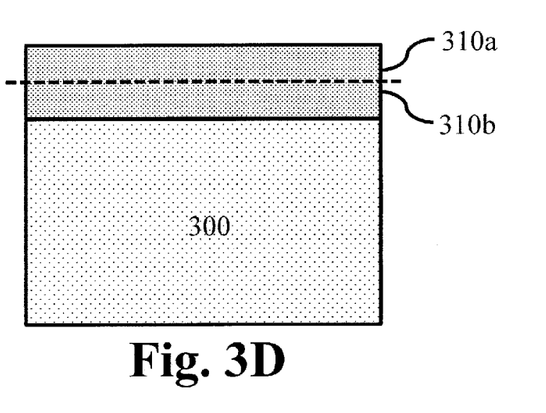
FIG. 3D shows an enlarged schematic cross-sectional view of the epitaxial layer and underlying drift region.

In some embodiments, it may be desirable to provide a difference in the dopant concentration gradients across the thickness of the epitaxial layer to provide charge collection enhancement and noise minimization. FIG. 3D presents an expanded view of the drift region and epitaxial layer. In some embodiments, the epitaxial layer may include two or more regions such as first region 310a and second region 310b. The demarcation between the two regions is indicated by the dashed line in FIG. 3D. The first region may extend from the outer surface of the epitaxial layer to a first depth beneath the outer surface of the epitaxial layer. The second region may extend between the first region and the interface between the epitaxial layer and underlying drift region. In some instances the first depth may be approximately 0.1 µm. The first region may have a doping concentration that is greater than that of the second region. The first region may also have a doping concentration gradient that is greater than that of the second region. In one embodiment, the doping concentration of the first region may vary from approximately $10^{19}/cm^3$ to approximately greater than $10^{16}/cm^3$. The corresponding doping concentration of the second region may range from approximately greater than $10^{16}/cm^3$ to approximately $10^{15}/cm^3$. While specific depths, concentrations, and concentration gradients have been discussed it should be understood that the current disclosure is not limited to the specific values disclosed. Instead, the disclosure should be interpreted generally as teaching an epitaxial layer including two or more regions with different dopant concentrations and concentration gradients.

The resulting modified APD depicted in FIG. 3C operates similar to the APD described above in conjunction to FIG. 1. Without wishing to be bound by theory, it is believed that the greater dopant concentration gradient present within the epitaxial layer permits a reduction in the thickness of the drift layer while maintaining the necessary field gradient to reduce the chances of the electron hole pairs recombining at the surface of the APD. This may result in increased quantum efficiency. As noted in more detail in the examples, relative to reference APD's created using standard diffusion-based methods without an epitaxial layer with a steep dopant concentration gradient, the modified APD's exhibit improved quantum efficiency at wavelengths ranging from approximately 350 to 1050 nm, increases in the timing response of the detector, and reduced error (or jitter) for timing applications. The modified APD's produced by this method may exhibit improved responsivity in the UV/blue region of the spectrum. The modified APD's produced by this method may also exhibit improved temporal responses, where temporal response refer to one or more of rise time, fall time, recovery time, bandwidth, and/or jitter. The modified APD may also produce improved responsivity and temporal response in other regions of the spectrum as the current disclosure is not limited in this fashion. For example, in silicon devices the improved response might extend from approximately 200 nm to approximately 1100 nm.

In certain embodiments, the above disclosed manufacturing methods and associated may be used to manufacture the modified APD's also described herein. The modified APD's may exhibit a variety of improved properties. In one embodiment a modified APD may exhibit a p-type depletion region width of approximately 30 to 50 μm when a high bias is applied. For typical devices the high bias voltage may range from approximately 1700 V to 1900 V. However, depending on the particular device it is possible that the high bias voltage could be greater than or less than the above noted range. For a wavelength of approximately 405 nm a modified APD may exhibit: a rise time equal or less than approximately 0.7 ns; a fall time approximately equal to or less than 4 ns; a bandwidth approximately equal to or greater than 200 MHz; an internal quantum efficiency approximately equal to or greater than 60%; and/or a responsivity approximately equal to or greater than 13 A/W. For a wavelength of approximately 365 nm a modified APD may exhibit: a rise time approximately equal to or less than 10 ns; a fall time approximately equal to or less than 80 ns; a bandwidth approximately equal to or greater than 10 MHz; an internal quantum efficiency approximately equal to or greater than approximately 30%; and/or a responsivity approximately equal to or greater than 4 A/W. Given the above noted properties at a wavelength of 365 nm, the above disclosed modified APD's may be used as a high sensitivity and short response time UV/Blue sensitive avalanche photodiode. In addition, a plurality of the modified APD's disclosed herein may be used to create an array of photodiodes.

EXAMPLES

Several modified APD devices were produced using the above disclosed method, where different amounts of the photosensitive p-layer were removed. The amount of material removed for each device corresponded to the desired target width of the p-type depletion region (i.e. the p-type depletion region width). The resulting full p-type thicknesses were 30 μm for device 30, 43.5 μm for device 40, and 40 μm for device 45. APD's that were fabricated according to the methods disclosed in U.S. Pat. No. 7,268,339 using standard diffusion-based methods were also included in the tests and are labeled as Reference A and Reference B in the figures.

Figure 4:
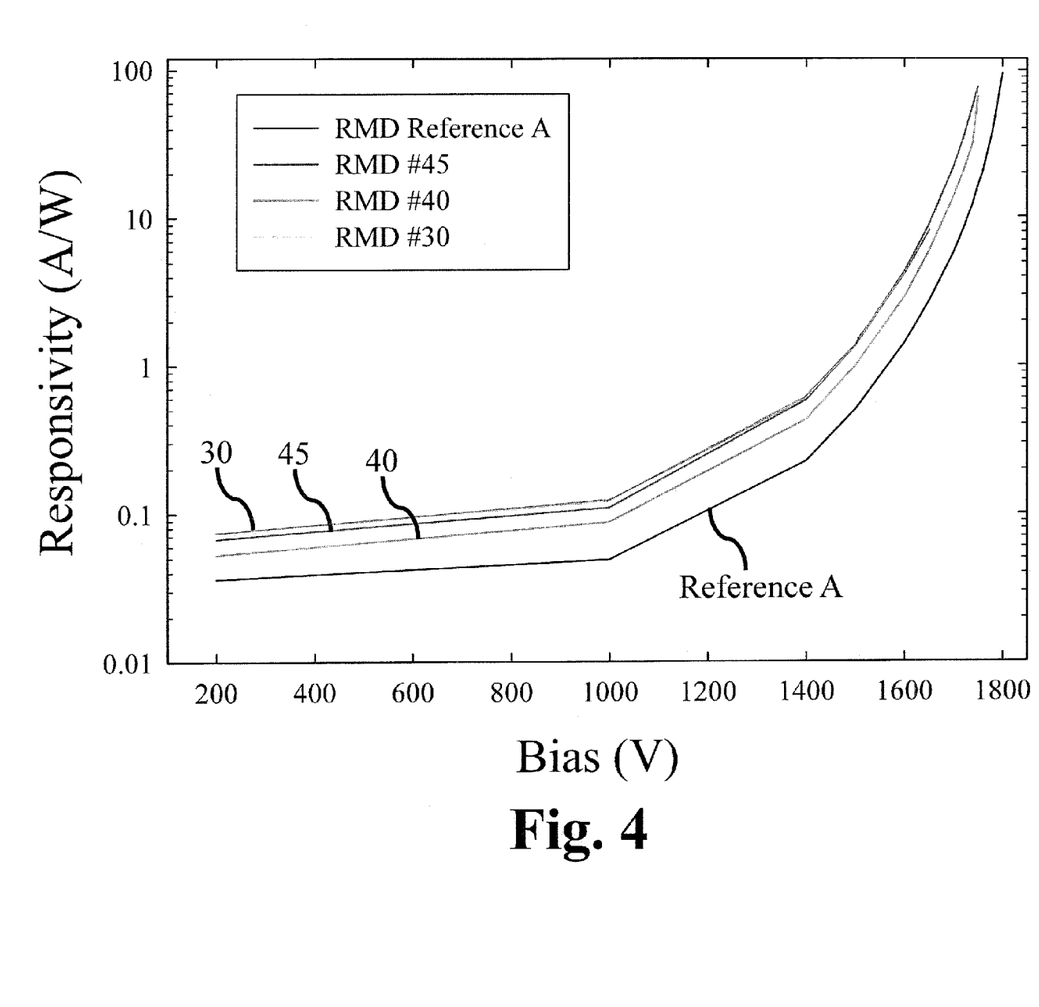
FIG. 4 is a graph of responsivity versus bias voltage for a wavelength of 365 nm.

The signal response of each device was measured as a function of bias, as well as the dark current using a picoammeter, or oscilloscope, connected to the cathode of the detector and the bias connected to the anode. The quantum efficiency (QE) and reflectivity was estimated for each detector and the results are presented in Table 2. The external QE represents the measured output value, while the internal QE takes into account only the amount of light that interacts with the detector and subtracts the reflected light. While QE is an important specification, the accepted value is often debatable because it is difficult to determine when the APD is operating under unity gain. Some bias is required to ensure that charges are not being trapped at the surface, but the bias where this occurs, prior to the onset of gain does not always represent optimal performance. For the current testing 200 V was selected because the signal is reasonably constant until a bias of greater than 1000 V is reached. Responsivity is given by the photon-induced current generated by the detector at a fixed bias and temperature. An LED source centered at a wavelength of approximately 368 nm with a 15 nm FWHM was used for the response measurements. FIG. 4 shows the detector responsivity as a function of bias for each detector. The modified detectors had a higher response at lower bias (gains) due to improved QE.

TABLE 2

| Detector | External QE (%) | Reflectivity (%) | Internal QE (%) |
| --- | --- | --- | --- |
| Reference A | 15 | 25 | 20 |
| #45 | 30 | 50 | 60 |
| #40 | 22 | 50 | 44 |
| #30 | 30 | 50 | 60 |

Figure 5:
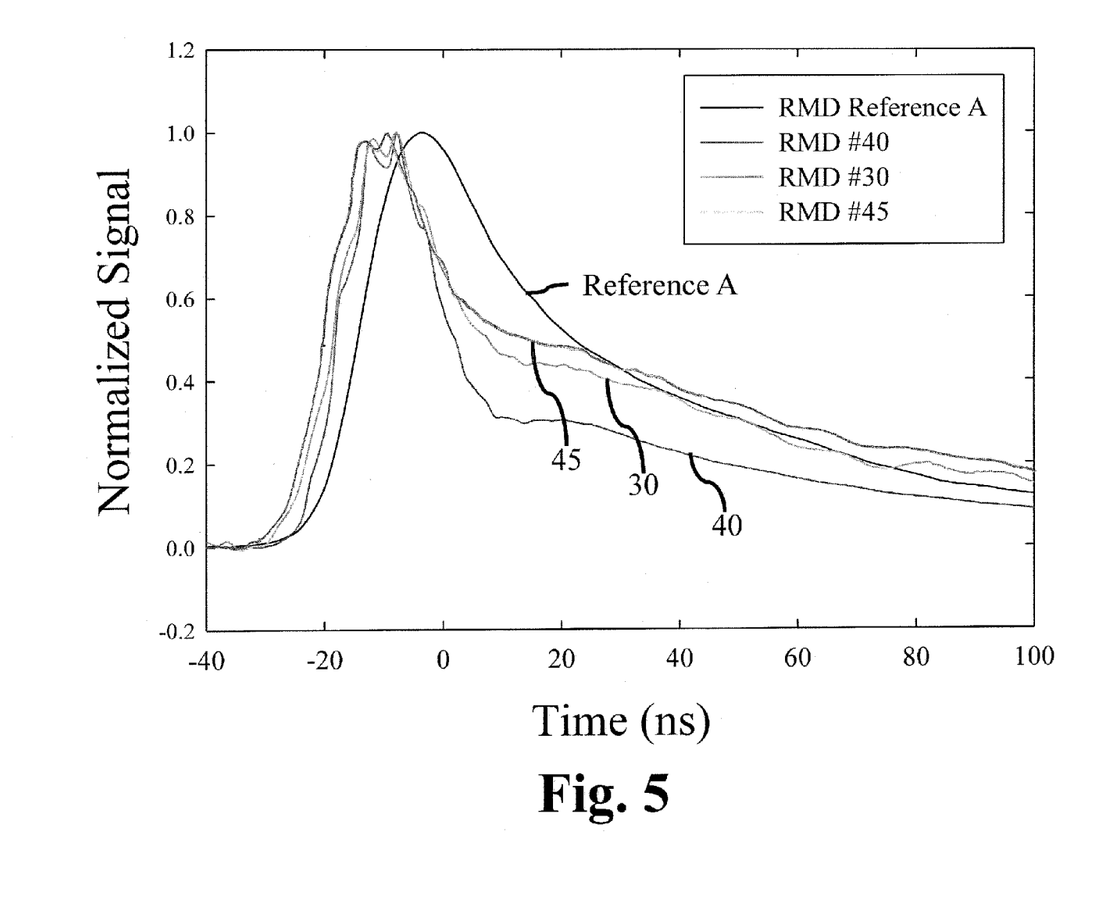
FIG. 5 is a graph of the response of different avalanche photodiodes to an approximately 12 ns laser pulse with a wavelength of approximately 355 nm.

Using a 355 nm laser source (Spectra Physics Quanta Ray Laser, model GCR-12) the responses of the modified APD's (devices 30, 35, and 40) and reference A were compared. A bias was applied to the each APD to achieve the minimum response time. The resulting time-averaged responses are shown in FIG. 5. The measured rise times were similar (approximately 7 ns) for most of the detectors, suggesting that the laser pulse rise was the limiting factor, although it was apparent that the response time of reference A was slightly longer.

Figure 6:
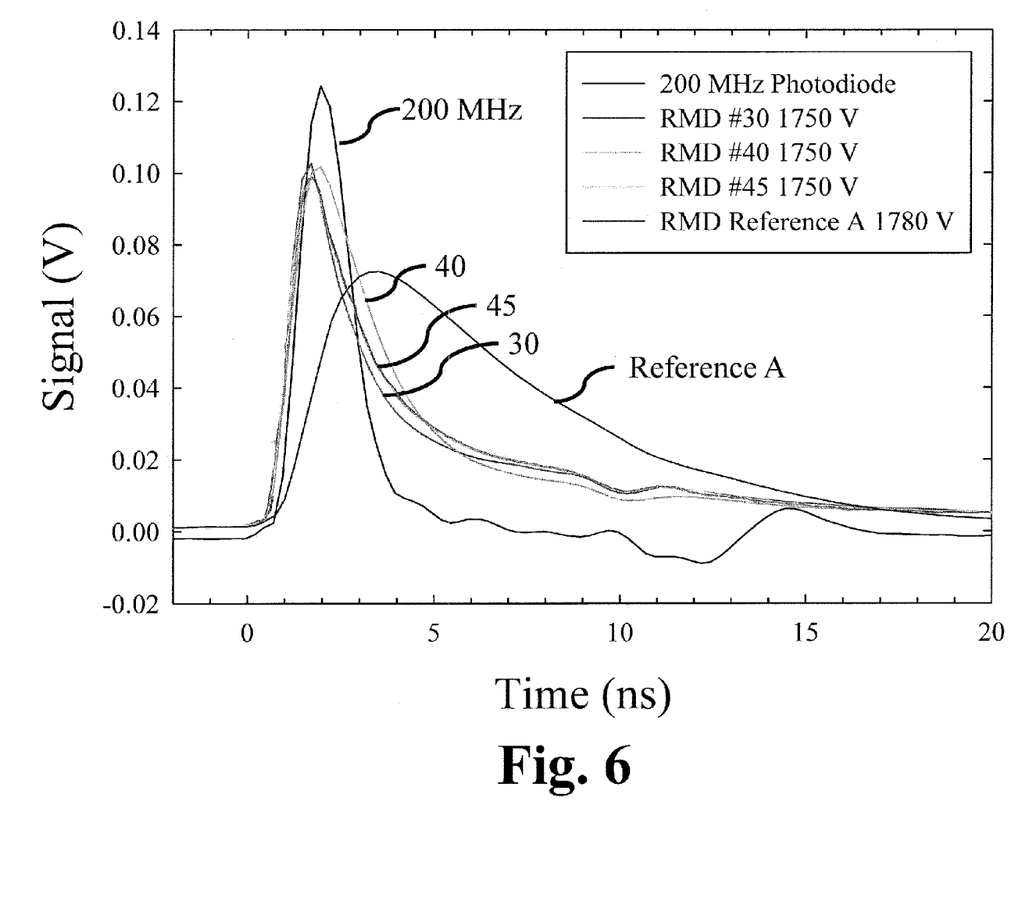
FIG. 6 is a graph of the response of different avalanche photodiodes to an approximately less than 1 ns laser pulse with a wavelength of approximately 405 nm.
Figure 7:
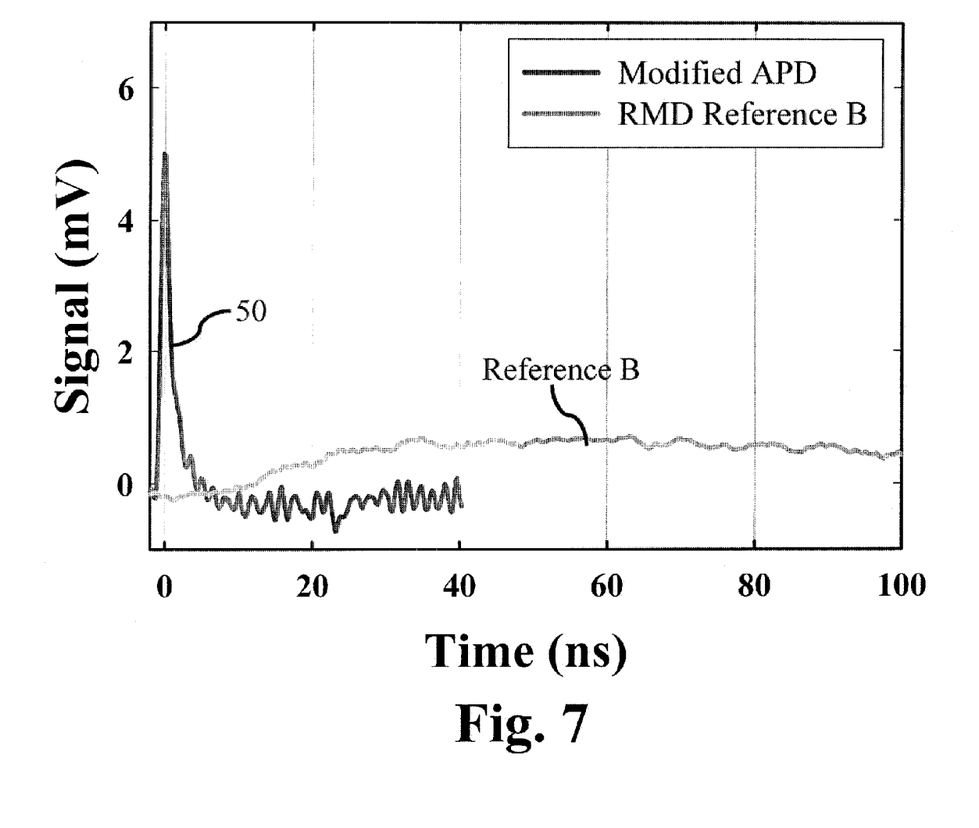
FIG. 7 is a graph of the temporal response of a reference avalanche photodiode and a modified avalanche photodiode.

The speed of response was measured for the modified APD's (devices 30, 35, and 40), a 200 MHz photodiode (200 MHz), and reference A, see FIG. 6. The speed of response of a modified APD, curve 50, and Reference B is also shown in FIG. 7. In both tests, the speed of response was measured relative to a short pulsed (i.e. less than 100 ps) 405 nm laser diode. A 2.5 GHz oscilloscope was used to record the data. A bias providing a gain of approximately 10 to 100 was applied to each APD and the output signal was sent directly to a 50-ohm terminated oscilloscope. As depicted in FIGS. 6 and 7, the modified APD's exhibited a full width half max response that was about four times shorter than Reference A and approximately twenty times shorter than Reference B.

Figure 8:
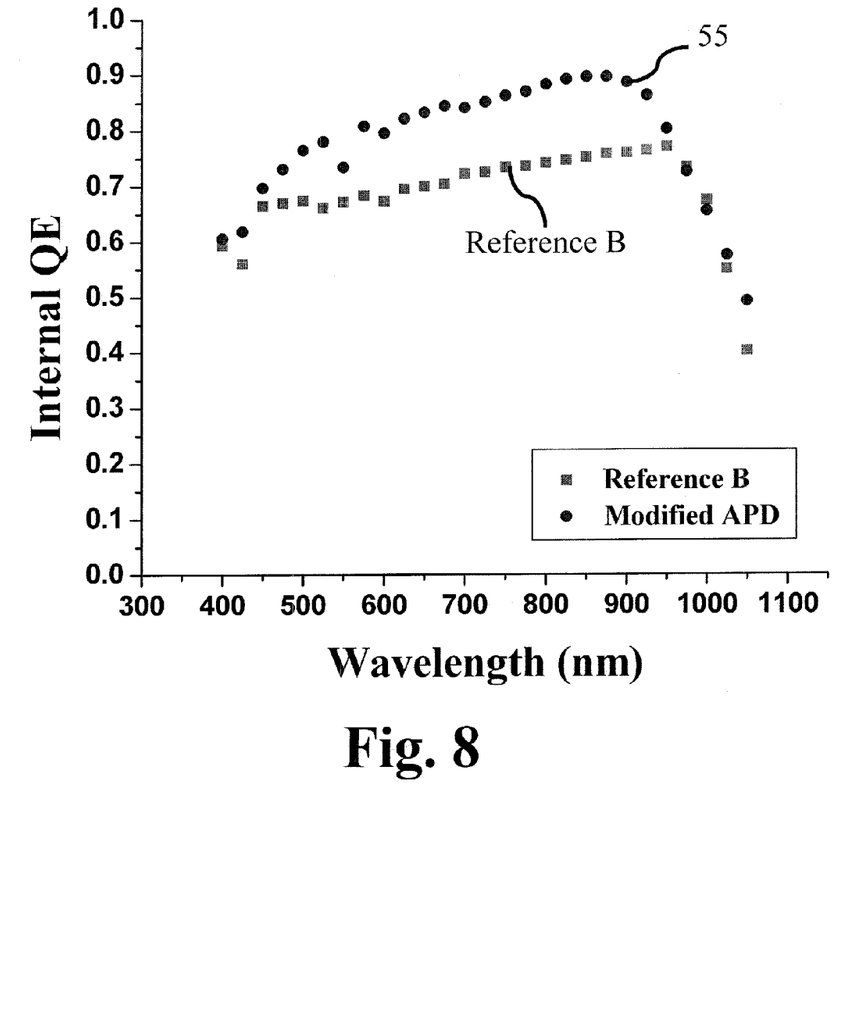
FIG. 8 is a graph of the measured internal quantum efficiency of a reference avalanche photodiode and a modified avalanche photodiode as a function of wavelength.

The internal quantum efficiency of the modified APD's as a function of the wavelength of incident radiation was determined relative to reference B. As depicted in FIG. 8, Quantum efficiencies approaching 90% were measured at wavelengths in the near-infrared (700 to 1100 nm) for the modified APD's, curve 55, which was approximately 25% higher than the efficiency measured for reference B.

While the above described embodiments have been directed to a device with a photosensitive layer that has been subject to p-type doping, it should be understood that the current disclosure is not limited to the specific embodiments described herein. For example, the current disclosure may also be applied to a photodiode and/or avalanche photodiode where the photosensitive layer has undergone n-type doping. In such an instance, the applied epitaxial layer would be doped n-type as well.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An avalanche photodiode comprising:
   a doped silicon substrate including a photosensitive surface and a drift region having a thickness of approximately 5 µm or less; and
   an epitaxial silicon layer disposed on the photosensitive surface, wherein a doping concentration of the epitaxial layer varies across a thickness of the epitaxial layer, wherein the doping concentration gradient in the epitaxial layer is greater than in the doped substrate.

2. The avalanche photodiode of claim 1, wherein a dopant of at least one of the epitaxial layer and substrate comprises at least one of boron, aluminum, and gallium.

3. The avalanche photodiode of claim 1, wherein the epitaxial layer is approximately between 0.1 µm and 10 µm thick.

4. The avalanche photodiode of claim 1, wherein the doping concentration changes from approximately $10^{21}/cm^3$ to approximately $10^{15}/cm^3$ across a thickness of the epitaxial layer.

5. The avalanche photodiode of claim 1, wherein the epitaxial layer includes a first region extending from an outer surface of the epitaxial layer to a first depth within the epitaxial layer and a second region disposed between the first region and an interface between the epitaxial layer and doped substrate, wherein the first region comprises a steeper doping concentration gradient than the second region.

6. The avalanche photodiode of claim 1, wherein the first depth is approximately 0.1 µm.

7. The avalanche photodiode of claim 1, wherein the first region has a doping concentration that changes from approximately $10^{21}/cm^3$ to greater than approximately $10^{16}/cm^3$ across a thickness of the first region.

8. The avalanche photodiode of claim 1, wherein the second region has a doping concentration that changes from greater than approximately $10^{16}/cm^3$ to approximately $10^{15}/cm^3$ across a thickness of the second region.

9. The avalanche photodiode of claim 1, wherein the photosensitive surface comprises a p-type material.

10. The avalanche photodiode of claim 1 further comprising at least one of a long pass filter, short pass filter, band pass filter, and antireflection coating disposed on the photosensitive surface.

11. The avalanche photodiode of claim 1, further comprising a depletion width of 30 to 50 µm when a high bias is applied.

12. The avalanche photodiode of claim 1, wherein a rise time of the avalanche photodiode for a wavelength of approximately 405 nm is less than or equal to 0.7 ns.

13. The avalanche photodiode of claim 1, wherein a fall time of the avalanche photodiode for a wavelength of approximately 405 nm is equal or less than 4 ns.

14. The avalanche photodiode of claim 1, wherein a bandwidth of the avalanche photodiode for a wavelength of approximately 405 nm is equal or greater than 200 MHz.

15. The avalanche photodiode of claim 1, wherein an internal quantum efficiency of the avalanche photodiode for a wavelength of approximately 405 nm is equal or greater than 60%.

16. The avalanche photodiode of claim 1, wherein a responsivity of the avalanche photodiode for a wavelength of approximately 405 nm is equal or greater than 13 A/W.

17. The avalanche photodiode of claim 1, wherein a rise time of the avalanche photodiode for a wavelength of approximately 365 nm is equal or less than 10 ns.

18. The avalanche photodiode of claim 1, wherein a fall time of the avalanche photodiode for a wavelength of approximately 365 nm is equal or less than 80 ns.

19. The avalanche photodiode of claim 1, wherein a bandwidth of the avalanche photodiode for a wavelength of approximately 365 nm is equal or greater than 10 MHz.

20. The avalanche photodiode of claim 1, wherein an internal quantum efficiency of the avalanche photodiode for a wavelength of approximately 365 nm is equal or greater than 30%.

21. The avalanche photodiode of claim 1, wherein a responsivity of the avalanche photodiode for a wavelength of approximately 365 nm is equal or greater than 4 A/W.

22. The device of claim 1 wherein a scintillator is operatively coupled to the avalanche photodiode.

23. A high sensitivity and short response time avalanche photodiode produced by the method of claim 1.

24. An array of photodiodes comprising a plurality of the avalanche photodiodes of claim 1.

* * * * *